United States Patent [19]
Molnar

[11] Patent Number: 5,339,335
[45] Date of Patent: Aug. 16, 1994

[54] METHOD AND APPARATUS FOR DIGITALLY PROCESSING AND FILTERING SIGNALS IN INDUSTRIAL CONTROL APPLICATIONS

[75] Inventor: Richard J. Molnar, Willoughby, Ohio

[73] Assignee: Elsag International B.V., Amsterdam, Netherlands

[21] Appl. No.: 990,516

[22] Filed: Dec. 15, 1992

[51] Int. Cl.$^5$ .............................................. H04B 1/10
[52] U.S. Cl. ...................................... 375/103; 370/60; 364/572; 328/162; 328/167
[58] Field of Search ...................... 375/103, 60, 99, 58; 364/551.01, 552, 571.01, 572, 574; 328/149, 167, 162

[56] References Cited
U.S. PATENT DOCUMENTS

| | | | |
|---|---|---|---|
| 3,970,944 | 7/1976 | Huellwegen | 375/103 |
| 4,607,278 | 8/1986 | Flamm | 328/165 |
| 5,123,032 | 6/1992 | Hershberger et al. | 375/103 |

*Primary Examiner*—Stephen Chin
*Assistant Examiner*—Amanda T. Le
*Attorney, Agent, or Firm*—Michael M. Rickin; Paul R. Katterle

[57] ABSTRACT

A device which is a combination of a method and apparatus and a filter, such as but not limited to, a conventional lag filter for digitally processing and filtering signals used in industrial control applications. The method and apparatus provides a factor which is used by the filter to process the digital signal at the input to the device. The method determines if the change in the input signal is either due to noise or a valid signal change. Information which gives a past analysis of the trend in direction of the signal at the input to the device is used in the method. The trend information includes a factor representative of the past history of the trend. The method uses the most recent trend indicator to determine to a reasonable degree of confidence if the signal currently at the input to the device is or is not characteristic of noise. If the signal at the input is not believed to be characteristic of noise, then the method adjusts the trend indicator by a tracking credit. The tracking credit is, in effect, a further degree of confidence that change in the input signal is not characteristic of noise. The method minimizes the tradeoff between valid signal response time and noise rejection associated with the prior art filters.

2 Claims, 5 Drawing Sheets

METHOD AND APPARATUS FOR DIGITALLY PROCESSING AND FILTERING SIGNALS IN INDUSTRIAL CONTROL APPLICATIONS

1. Field of the Invention

This invention relates to digital signal processing and filtering in industrial control applications and more particularly to a method and apparatus for use in such signal processing and filtering which significantly reduces the noise content of analog signal measurements.

2. Description of the Prior Art

Typically an industrial controller measures an input signal which may, for example, come from a sensor. The analog signal from the sensor is transformed by a standard analog to digital converter into a digital signal representative of the analog signal. It is often common for the analog sensor signals coming into the controller to be very noisy. Therefore, the digital signals representative of the sensor signal will reflect this noise content.

Often standard digital signal processing techniques, such as a conventional lag filter or moving average filter, are used within the controller to dampen out the noise content of the incoming signal. The problem with using such standard digital signal processing techniques is that there must be a compromise between noise damping and signal response time. In other words, a signal which is heavily dampened will reject noise very well but will be very slow to respond to a valid signal change. On the other hand, a lightly damped signal will track valid signal changes well but will also track noise more than a heavily dampened signal and have poor noise rejection properties.

A lag filter used in a discrete time frame such as found in microprocessor based controllers with control cycles can have a form such as $$\text{lag}(n) = \text{lag}(n - 1) + \frac{w(n) - \text{lag}(n - 1)}{\text{damping weight}} \quad (1)$$

where w(n) is the current value of the sensor signal, lag(n−1) is the value of the lag filter from the previous control cycle, lag(n) is the value of the lag filter in the current control cycle and the damping weight determines the filter response. Notice that the script "n" refers to a discrete time interval such as a control cycle where w(n) is a sampled measurement of the incoming analog sensor signal w(t) performed by the standard analog to digital converter.

The way the lag filter works is that it compares the difference between the new sensor value and the previous lag filter value. The current lag filter value becomes the previous lag filter value plus a fraction of this difference which is dictated by the value of the damping weight. Sometimes the lag filter is defined in terms of discrete intervals of time as in the following equation $$\text{lag}(n) = \text{lag}(n - 1) + \frac{dt[w(n) - \text{lag}(n - 1)]}{TC + dt} \quad (2)$$

where dt is the time period of the control cycle and TC is the time constant associated with the damping weight of the filter. For example, the output response of this filter will reach 63.2% of the input step value in the amount of time defined by the time constant.

In contrast to the lag filter, a moving average filter consists of a number of previously stored measurement values as well as the current measurement value. The output of the moving average filter is simply the average of the predetermined number of stored measurements. A moving average takes the form of $$MA(n) = \frac{w(n) + w(n - 1) + w(n - 2) \ldots}{\text{number of stored values}} \quad (3)$$

where MA(n) is the current output of the moving average filter and w(n), w(n−1), and so on are the past values of the sensor signal.

As a larger number of values are stored, an average over a larger number of samples is performed which in turn produces more noise rejection properties. However, if the signal has a valid change, the output of the moving average will be slow to respond to it. One way to think of it is that the more stored values that are in a moving average, the more stored values that will have to change given a change in sensor signal input. Like the lag filter there is a tradeoff between noise rejection and valid signal response. If less values are stored and averaged the valid signal change can be tracked closer but at the expense of less noise rejection properties.

SUMMARY OF THE INVENTION

A unique non-conventional method is used in the "smart filter" of the present invention to determine how to adjust a value in a recursive fashion every control cycle. The novelty lies in the invention's ability to differentiate between random noise, noise spikes and true input signal change which appear at the input to the industrial controller. The smart filter uses this distinction to assign dynamic damping weight factors to the filter. The invention may use any type of filter or digital signal processing (DSP) technique such as, but not limited to, a lag filter, windowed filter, or a moving average filter.

DESCRIPTION OF THE PREFERRED EMBODIMENT

Figure 1:
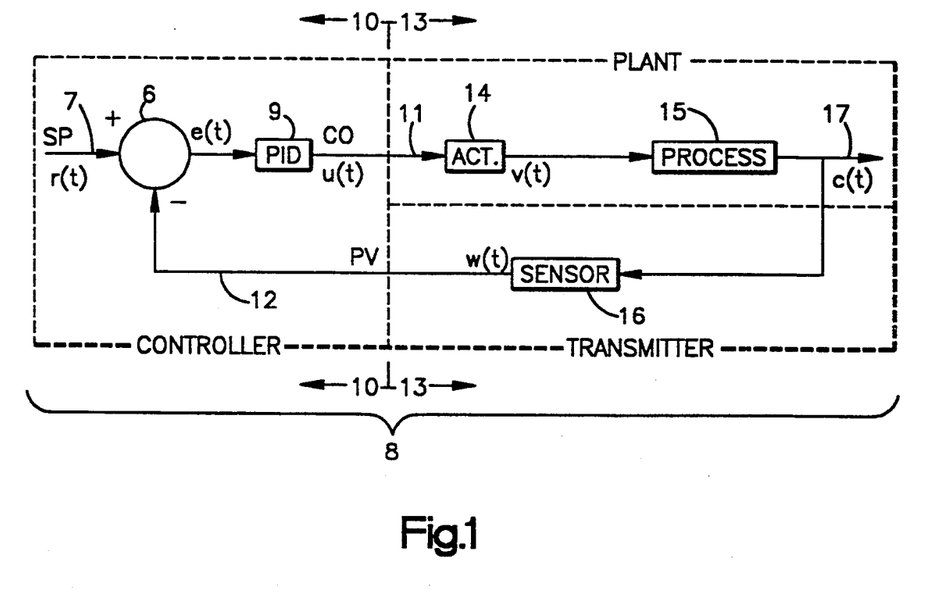
FIG. 1 is a general block diagram of an industrial process control loop wherein the smart filter of the present invention can be used.

The smart filter of the present invention may be used in an industrial process control application such as 8 in FIG. 1. As is shown in FIG. 1, the process control application 8 includes a controller 10 and a field process system 13. The controller 10 comprises proportional, integral and derivative ("PID") unit 9 which includes therein the PID algorithm. The field process system includes actuator 14, process 15 and sensor 16. The controller 10 acts on the field process system 13 at certain discrete intervals of time, commonly referred to as control cycles.

The desired value of the actual output 17 of process 15 appears at input 7 of the controller as the setpoint ("SP"). Sensor 16 senses the actual process output to provide the analog process variable ("PV") signal at input 12 to the controller. The analog PV represents the value of the actual process output 17. In response to the PV and the SP, the controller uses the PID algorithm to calculate and generate at its output 11 the control output ("CO"). The control output is transferred to the process 15 through actuator 14.

Figure 2:
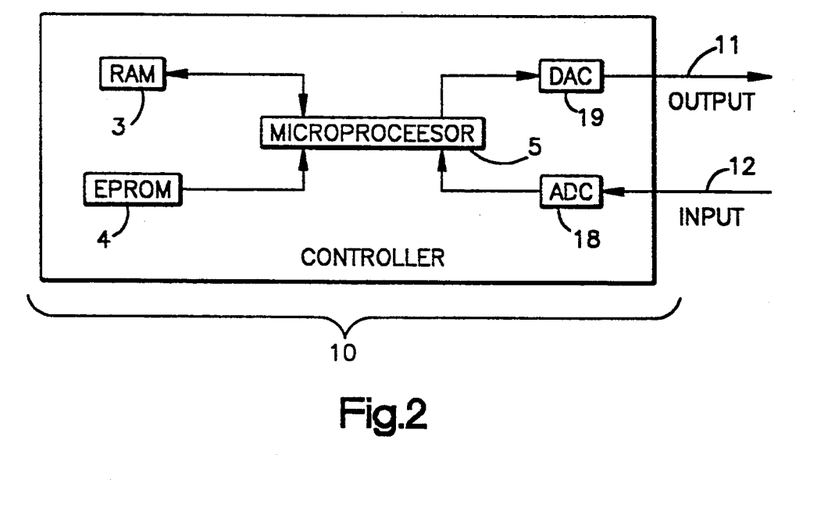
FIG. 2 is a block diagram of the hardware within the controller of the loop of FIG. 1 which performs the functions of the invention.

Referring now to FIG. 2, there is shown a simplified block diagram for controller 10. Controller 10 includes microprocessor 5 which can change the control output at output 11 through digital to analog converter (DAC) 19 and can monitor the PV (an analog signal) at input 12 through analog to digital converter (ADC) 18. The DAC 19 converts the digital control signal generated by the microprocessor into the analog control output at output 11. The ADC 18 converts the analog PV signal to a digital signal. The sampling time for the ADC 18 is usually the same as the control cycle.

Associated with microprocessor 5 are random access memory (RAM) 3 and erasable programmable read only memory (EPROM) 4. The internal program for running the microprocessor 5 is stored in the EPROM 4. The microprocessor 5 can use the RAM 3 to store data such as the digital signal which represents the value of the actual process output obtained from the sensor 16. The program executing in EPROM 4 tells the microprocessor 5 how to manipulate the data in RAM 3 or how it should change the control output at the output 11 of controller 10.

One example of an application 8 wherein the smart filter of the present invention may be used is the control of the temperature of process 15. In such an application a thermocouple may be used as sensor 16 to provide the input signal 12 representative of the temperature at the process output 17. Some thermocouples have very sensitive voltage to temperature relationships. For example, a type "S" thermocouple may produce only about 3 microvolts for a one degree Fahrenheit temperature change. Very noisy industrial applications can easily produce noise which is several orders of magnitude larger than this 3 microvolts on the thermocouple sensor input. Hence, a temperature reading could be bouncing several orders of magnitude, solely due to noise which is clearly unacceptable in process control and monitoring applications.

Figure 3:
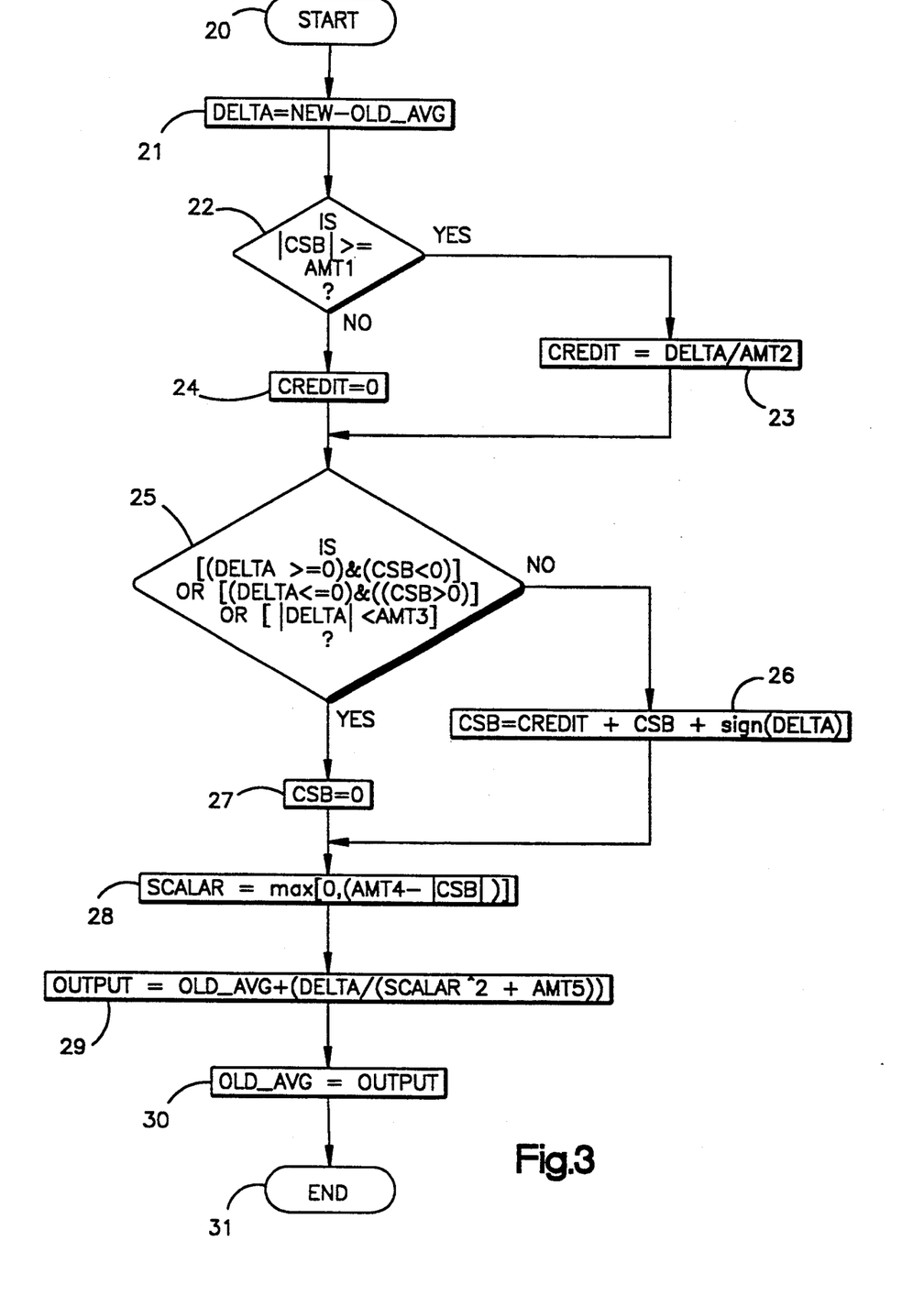
FIG. 3 is a flow chart that depicts the programming logic which is necessary to arrive at the smart filter of the present invention.

Referring now to FIG. 3, there is shown a flowchart of the programming logic in EPROM 4 which implements the smart filter. As will be understood from the description of the flowchart, the smart filter is a device which is a combination of the method and apparatus of the present invention and a filter, such as but not limited to, the conventional lag filter described in connection with FIG. 3. As will also be understood from the description of the flowchart of FIG. 3, the method and apparatus of the present invention provides a factor which is used by the filter (hereinafter "filter factor") to process the digital signal at the input to the device.

The programming logic uses a technique to determine if the change in the input signal is either due to noise or a valid signal change. As will be described in more detail below, the logic uses information which gives a past analysis of the trend in direction of the signal at the input to the device. The trend information (hereinafter "trend indicator") includes a factor representative of the past history of the trend. As will also be described in more detail below, the logic uses the most recent trend indicator to determine to a reasonable degree of confidence if the signal currently at the input to the device is or is not characteristic of noise. If the signal at the input is not believed to be characteristic of noise, then the logic will adjust the trend indicator by an amount which hereinafter will be referred to as a "tracking credit". The tracking credit is, in effect, a further degree of confidence that change in the input signal is not characteristic of noise. The technique minimizes the tradeoff between valid signal response time and noise rejection associated with the prior art filters. The specific steps in the programming logic are described below.

Referring to the flowchart in FIG. 3, the smart filter in step 21 takes the new value of the PV measured on the current control cycle and subtracts the old average value from step 30 to determine the delta value. The old average value is the output of the smart filter on the previous control cycle. A separate cumulative status byte (CSB) value determined in accordance with either step 26 or 27, as well as the old average value, is stored in RAM 3 and is associated with each PV input signal (the logic of FIG. 3 can be used for a multiplicity of PVs) that is to utilize the smart filter. The CSB is the trend indicator. The absolute value of CSB is checked against AMT1 in step 22. AMT1 is selected as a minimum of trend occurrences before the smart filter will start to credit the input signal as a truly changing level as opposed to noise. Step 24 shows that if the CSB is less than AMT1 then no credit is given.

For purposes of illustration herein and without intending to limit the scope of my invention, a value of 2 was selected for AMT1. When the absolute value of CSB is equal to or exceeds this value for AMT1, the tracking credit is given to this change in input as is seen in steps 22 and 23. The credit has a scaling factor AMT2 which can be set for instance to a value of double the largest anticipated noise level for the application wherein the smart filter is to be used. The scaling factor AMT2 determines the minimum change that must occur in input signal amplitude before the change is allowed to contribute to the credit. In this example a value of 0.4 was assigned to AMT2 based on the level of random noise in the input signal shown in FIG. 4. If credit is stored in integer form and the absolute value of CSB is less than AMT2, then the credit equals zero (i.e. the credit is truncated).

Next in step 25, the smart filter determines if the absolute delta value is either smaller then an amount AMT3 (which represents the maximum amplitude in which the input signal is considered noise) or if the delta value is in conflict with the past trend in CSB by comparing the polarities of the delta value with the CSB. If any one of the above described determinations are true, then CSB is returned to zero as shown in step 27. AMT3 may be set to a value which defines a windowed range around the output value of the smart filter where the largest damping weight is desired. A value of 0.02 was selected to be AMT3 in this case.

If the CSB trend agrees with delta value then in step 26 the CSB is adjusted by adding the credit to the CSB as well as the sign function output of the delta value [sign(DELTA)]. The sign(DELTA) returns a plus one if the delta value is positive, zero if the delta value is zero, and a negative one if the delta value is negative. The smart filter then determines in step 28 the scalar (SCALAR) value, i.e. the filter factor, based on this adjusted CSB. The SCALAR in this example is defined as a positive value or zero, where negative values are set to zero. The max (0,answer) function in step 28 returns the answer if it is positive and zero if the answer is zero or negative. AMT4 is used to define the largest SCALAR value which is desired; hence, this defines the heaviest (largest) damping weight. Step 28 shows that when the CSB is zero the SCALAR will be largest and never less than zero.

In step 29 the output of the smart filter is the previous output adjusted by a fraction of the current delta value. The adjustment consists of the delta value divided by the sum of the SCALAR squared plus an amount AMT5. The amount AMT5 can be set to the least amount of desired damping weight. Note that AMT5 must be greater than zero to prevent a division by zero in step 29. In this example AMT5 equals one. Just prior to leaving the routine, the old average value is set to the value of the current output in step 30.

It is worth noting at this point that step 29 in the present invention can be replaced with a conventional lag filter whose time constant is defined by the SCALAR value in step 28. Likewise, a conventional moving average filter could also replace step 29, where the number of averaged stored measurements is based on the SCALAR value in step 28. This flexibility of the present invention allows a variety of filter types to benefit from the performance of the smart filter.

The above stated values were used in connection with the flowchart of FIG. 3 as an example of the smart filter of the present invention.

Figure 4:
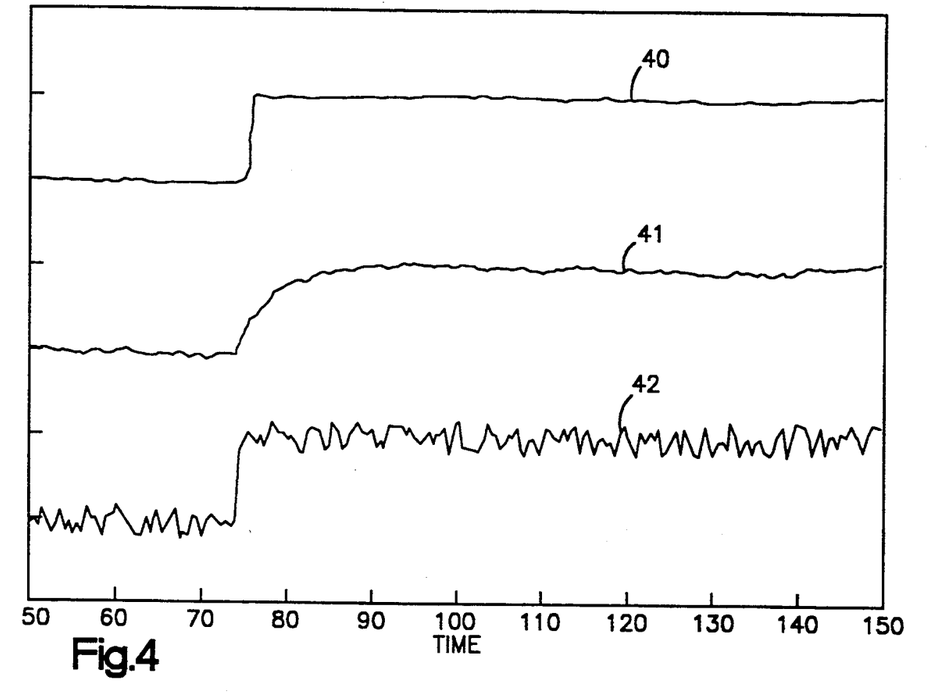
FIG. 4 is a plot showing a noisy step input signal and the resulting waveforms at the outputs of a conventional lag type filter and the smart filter of the present invention.
Figure 5:
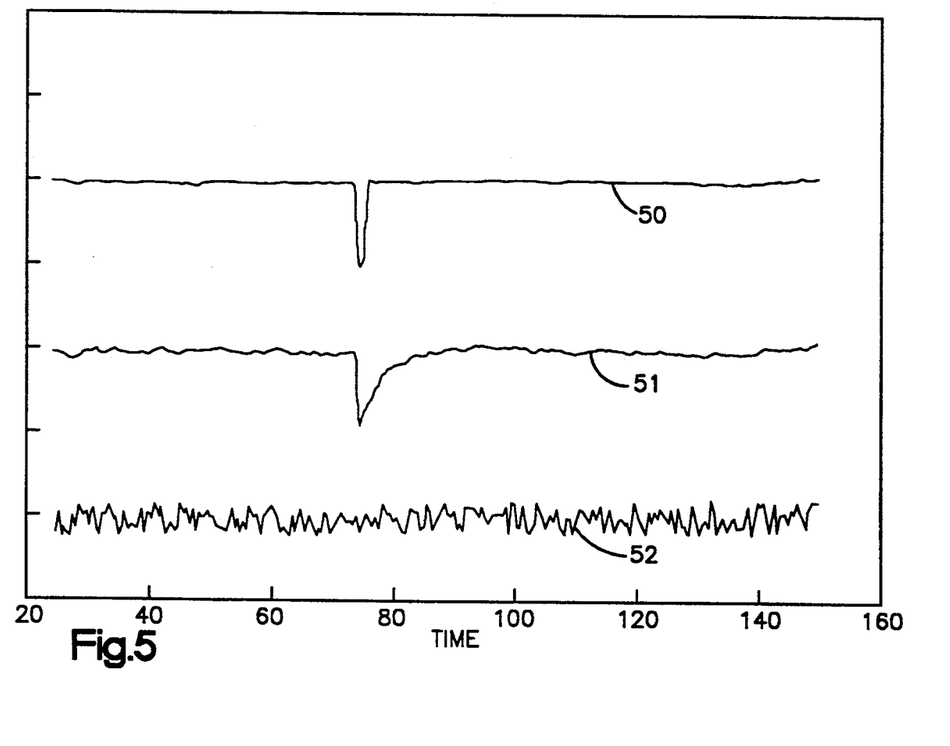
FIG. 5 is a plot showing the real time error of the noisy signal, lag filter response, and the smart filter response as compared to the ideal step.
Figure 6:
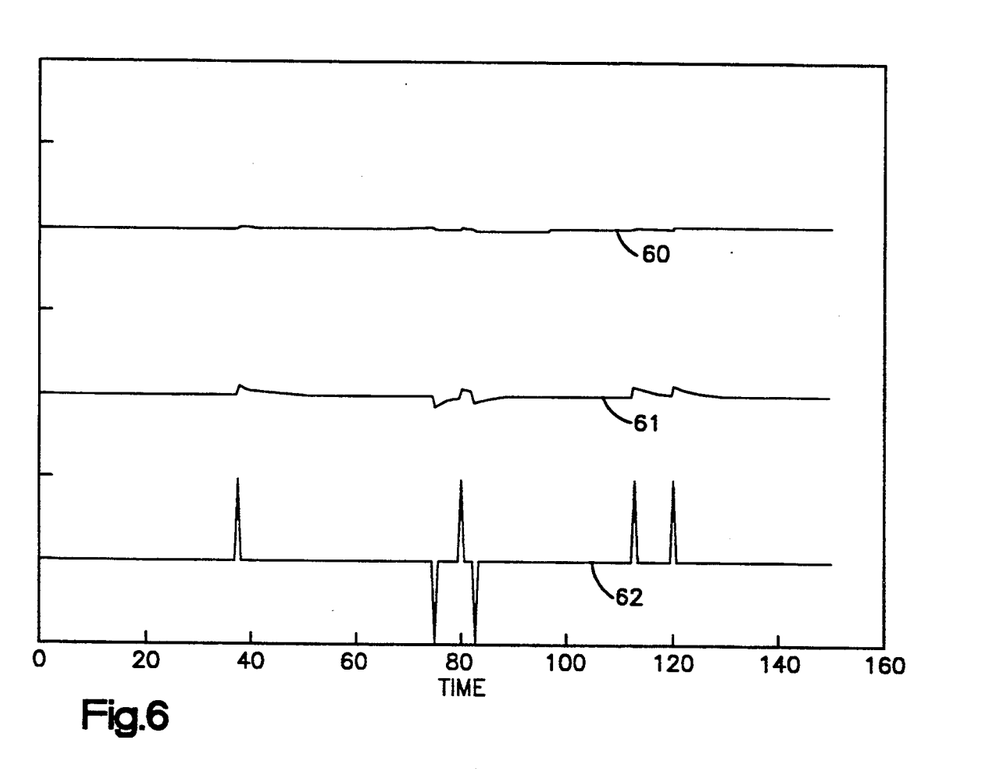
FIG. 6 is a plot showing a steady state input signal with large noise spikes superimposed on it. The lag filter response as well as the smart filter response is shown.

FIGS. 4 through 6 show the superiority of the smart filter over a conventional lag filter on a noisy process. A conventional moving average type filter can behave very similarly to the conventional lag filter by adjusting the number of stored values and damping weight, respectively. Hence, for demonstrative purposes only the conventional lag filter with a damping weight of 8 will be compared to the smart filter of the present invention.

From FIGS. 4 to 6 and the description below it can be seen that it would be necessary to increase the damping weight of the lag filter in order for that filter to achieve the attenuation of the smart filter when the signal is close to steady state. However, increasing the damping weight of the conventional lag filter also decreases the tracking ability of the lag filter; thereby increasing the time of the step response of that filter (i.e. a slower more sluggish response). Likewise, reducing the damping weight of the lag filter to allow it to track the signal response closer will sacrifice the lag filter's noise filtering property.

The magnitudes and time scales in FIGS. 4 through 6 are irrelevant since they are scaleable in nature and application. Hence, damping weights, control cycle time, and relative input level may change from one process control application to another; but, the overall benefits provided by the smart filter as compared to conventional filtering techniques will remain applicable.

The input step signal 42 shown in FIG. 4 has noise superimposed on it. FIG. 4 shows the response 40 of the smart filter and the response 41 of the conventional lag type filter to the step input signal 42. The ideal output response to the step input signal would be a perfect step waveform. It can be seen in FIG. 4 that the smart filter response reflects this attribute as compared to the response of the conventional lag type filter.

FIG. 5 show waveforms which allow a comparison of the real time error of the smart filter response 50, the conventional lag filter response 51 and the noisy step input signal 52 to the ideal step response. The noisy input signal 52 is simply the noise which was superimposed on the ideal step. The lag filter error 51 shows a sharp jump and gradual decay around where the step occurs. This is due to the fact that the conventional lag type filter has a slower response (longer response time) to the true step in signal. Initially the lag filter response is off by approximately the amount of the step. As time goes on the lag filter response slowly closes in on the step which by this time becomes a major contributor to the error in the lag filter response. The smart filter error 50 does have an initial error similar to the lag filter error. However, the smart filter response recovers much quicker than the conventional lag filter response.

Associated with each of the waveforms shown in FIG. 5 is a "Squared Error Sum". The Squared Error Sum reported for each waveform was determined by first subtracting the ideal step response from each filter response and squaring the amount for each cycle. These squared differences from each cycle are then summed for each individual response over the period shown in the figure. The Squared Error Sum is a means of comparing the relative measure of error in the smart filter and the coventional lag filter responses to the ideal step response; hence, the lower the Squared Error Sum the better the response of the filter to the step. From FIG. 5 it can be seen that the smart filter has the lowest Squared Error Sum and therefore has the best response.

Notice that over the time frame shown in the figure, the lag filter appears to produce more error than the noise itself. This is because the slow step response inherent to the lag filter has caused the majority of the error over this time frame. Given a longer time frame with only one step, the lag filter output error would likely reduce below the noise error; however, it would continue to remain inferior to the performance of the smart filter of the present invention.

FIG. 6 shows a steady state input signal 62 with large noise spikes superimposed on it. The process controller should not respond to the large noise spikes as they are not valid signal changes. As can be seen in FIG. 6, the smart filter response 60 continues to filter heavily in the presence of incoming noise spikes. However, the lag filter response 61 is influenced by each noise spike even though a noise spike is not a valid signal change. Therefore, once again the lag filter response 61 introduces much more error to the true signal (DC in this case) when compared to the smart filter response 60.

As described above, the response of the smart filter is substantially better than the response of the conventional lag filter. While not shown in FIGS. 4 to 6, those skilled in the art will appreciate that the response of the smart filter will also be better than the response of a conventional moving average type filter. In addition, one of the drawbacks to using the conventional moving average type filter is its inherent poor noise rejection to noise spikes. As soon as the noise spike enters as one of the stored measurements, the output of the moving average continues to weight that noise spike evenly with the other stored measurements until the noise spike measurement has been replaced in the limited number of chronologically stored measurements. This would produce a near squarewave effect for the conventional moving average output.

Step 25 of FIG. 3 may be altered to allow use of the smart filter in those process control applications where the signal response direction dictates the signal and noise characteristics. In these types of applications the levels which were set to zero for CSB and DELTA in step 25 could be set differently. For example, rather than the one qualifier in step 25 being '(DELTA<=0)&(CSB>0)' an application may benefit from this qualifier changing to '(DELTA<=−1)&(CSB>2)'. This would prevent the CSB from being zeroed out unless the delta value has gone more negative than −1 and the CSB is greater than two. This response would give a different response for a signal going in the positive direction from the response in the negative direction.

The present invention can be simplified for applications which do not require all of the sophistication of the smart filter. For example, by replacing step 23 with 'CREDIT=1', replacing step 26 with 'SCALAR=0', replacing step 27 with 'SCALAR=the maximum desired damping setting' and removing step 28 we easily accomplish the following functionality: AMT1 would represent the number of control cycles that the signal must agree in trend while maintaining an absolute delta value greater than AMT3 in order to track the signal; otherwise, damp the signal by the maximum SCALAR.

The present invention is portrayed above for an application which requires a low pass filter implementation. A form of a high pass filter implementation may be performed by the present invention by changing the '>=' in step 22 to '<', and in step 25 by changing the 'DELTA>= to DELTA<', the 'DELTA<=' to 'DELTA>', and '<AMT3' to '>=AMT3'.

Step 22 is mainly used to differentiate a valid change in signal from a noise spike on the signal. Step 22 could be replaced with a function which asks "Is the previous cycle delta value within AMT7 of the current cycle delta value?". AMT7 could be a magnitude value such as 0.154 or related as a percentage of the value such as 20%.

The SCALAR value which may be passed to a filter may be modified to be squared, cubed, or represent a power of 2 in order to achieve an accelerated rate at which the smart filter damping is changed. For example, a SCALAR of 3 might be cubed to pass a damping weight of 27. In a different case the SCALAR of 3 represents a power of 2 where 2 to the third power is a damping weight of 8.

One can implement the programming necessary for the invention in the flowchart of FIG. 3 when the values are in floating point. However, the smart filter of the present invention can also apply itself readily to integer format applications. The smart filter for integers would add one bit to the change in order to track to the input signal even when the damping weight factor is extremely large. For instance, in step 29 the output would still be the old average adjusted by the scaled delta amount; however, one would always want to round the scaled delta amount to the next integer so that it is never zero unless delta is zero. Alternatively, one can simply increment or decrement the old average value based on the sign of the delta, where a positive sign increments and a negative sign decrements the old average value. Again, a delta of zero would not increment or decrement the old average.

Furthermore, this invention may be carried over into a moving average filter application where the number of averaged stored measurements changes to reflect the SCALAR amount; hence, the filtering and quick response can be implemented in moving average form. The controller 10 (see FIG. 1) would store a certain amount of measurements of the process variable signal at input 12 chronologically. The amount of measurements the controller stored would reflect the heaviest (largest) desired damping weight for the moving average.

One application of the moving average could use the SCALAR term of 28 squared plus 1 to indicate how many measurements are to be averaged to determine the output of the smart filter. For example, if the controller stores up to 10 values for the moving average smart filter, and the current SCALAR is 2, then the SCALAR squared plus 1 is 5 and the output of the moving average smart filter is the average of the last 5 measurements.

Another form of the invention uses a method of multiple recursive iterations based on the SCALAR of the smart filter. The SCALAR value from step 28 could be based on from a value of one up to the absolute value of CSB. This SCALAR value squared would indicate how many times a heavy (large) damping weight lag filter should be run recursively during each cycle. Hence, if the CSB is zero the SCALAR is one and the squared SCALAR is one, having the lag filter run only once. If the CSB were 4 then the squared SCALAR would be 16 and the lag filter would run recursively 16 times in that control cycle. One can see that the more times a lag filter is run recursively, the more it tracks to the change in signal. Likewise, the less the lag filter runs each cycle, the more the noise rejection will take effect.

In addition, the invention is not limited to using the squared term of the SCALAR in step 28 as a means of determining the weight of the filter; the SCALAR could be cubed or simply used as itself. However, the squared SCALAR term provides an accelerated dynamic filter weight which allows the smart filter to respond from heavy damping to quick tracking in a relatively short period of time with minimal processing time.

A windowed filter version is another form of the invention which uses windowed values to determine the damping weight. For example, step 29 shows a term with 'SCALAR^2+AMT5' which can be substituted by a set of damping weights determined by a windowed value of CSB. The substitution may for example be 'If |CSB|<2 then the damping weight is 16, else damping weight is 4'. The advantage of this is that only a limited number of weights (two in this case) are used, and a window is set up around the CSB value to determine the damping weight.

Figure 7:
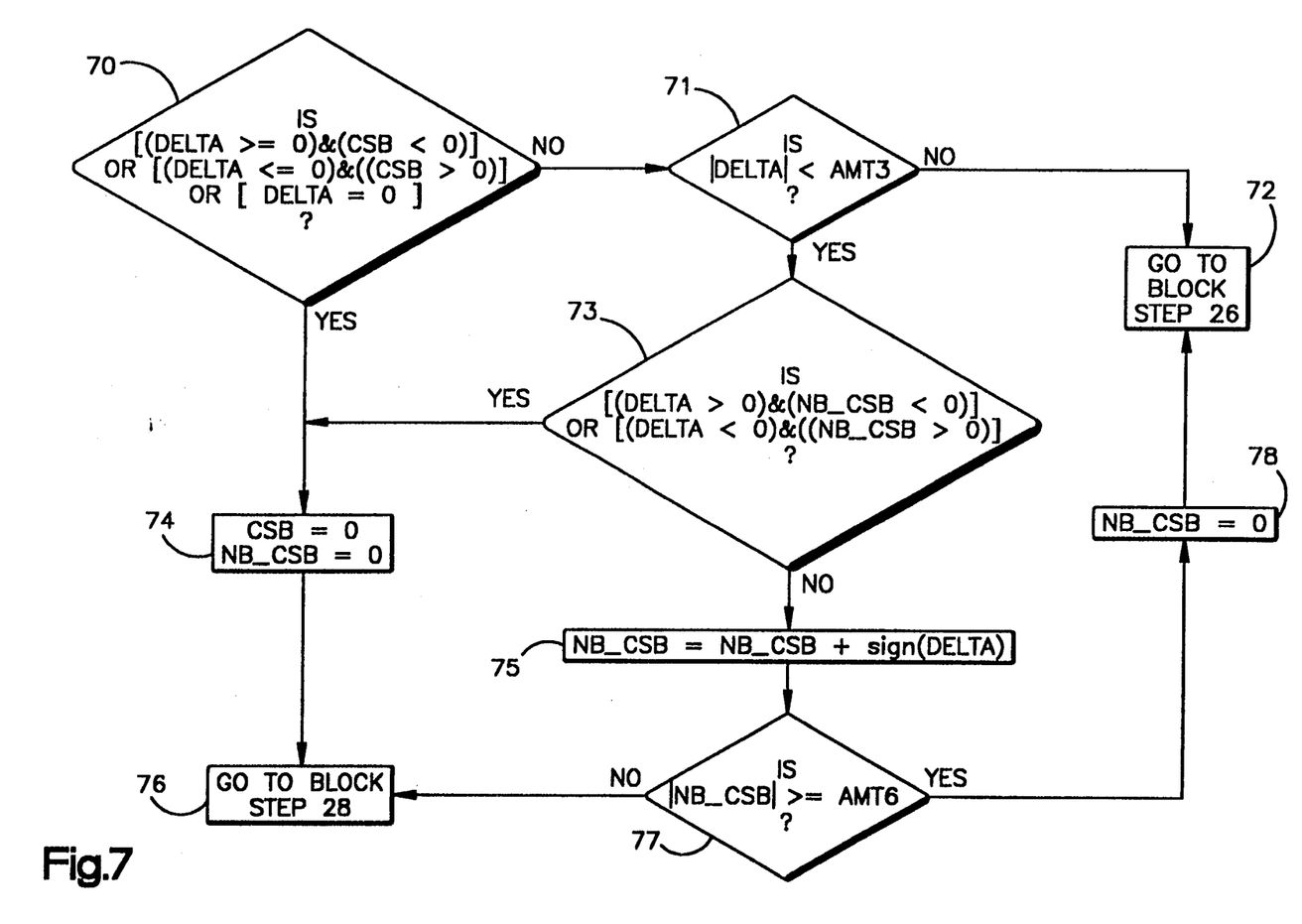
FIG. 7 is a flow chart that depicts the programming logic which is associated with an extension of the smart filter of the present invention.

FIG. 7 shows an extension of the present invention which allows signal trending within the defined noise band set by AMT3. Hence, rather than zero out CSB if the absolute delta value is less than AMT3, the trend is analyzed within this band with a NB_CSB which is the noise band cumulative status byte. This additional level of sophistication in the smart filter allows quicker response to a true signal change happening within the noise band. Step 70 in FIG. 7 would replace step 25 in FIG. 3. Likewise step 74 replaces step 27. All of the other steps in FIG. 3 remain as is with the addition of the steps in FIG. 7.

In step 70, the smart filter determines if the delta value is zero or if the delta value is in conflict with the past trend in CSB by comparing the polarities of the delta value with the CSB. If this is the case, CSB and NB_CSB are both set to zero as shown in step 74. Otherwise, the absolute delta value is checked in step 71 to determine if it is less than AMT3. If not, then we proceed to step 26 as shown by 72.

If the absolute delta value is less than AMT3 then we proceed to step 73. At this point we are operating inside of the noise band defined by AMT3. Step 73 determines if the delta value is in conflict with the past noise band trend of NB_CSB by comparing the polarities of the delta value with the NB_CSB. It should be appreciated that NB_CSB is a "noiseband trend indicator" which is also stored in the RAM. If the noise trend and the signal change (delta value) do not agree, then we proceed to step 74. Otherwise, if they do agree, NB_CSB is adjusted by the sign(DELTA) function as shown in step 75 and goes to step 77.

Step 77 asks if the absolute value of the noise band trend NB_CSB is greater or equal to an AMT6. If so, NB_CSB is set back to zero in step 78 and then goes to step 26 as shown by 72 where CSB will be adjusted to show trend recognition. AMT6 is set by the number of consecutive signal trends in same direction within the noise band which would constitute a valid signal change. For example if AMT6 is set to 5, then this requires the signal to trend in the same direction within the noise band for at least 5 consecutive control cycles before adjusting CSB to represent a valid signal change.

It should be noted that it is desirable to limit the value of CSB, NB_CSB, and CREDIT based on practically any version implemented using the present invention. For example, if CSB and NB_CSB are represented as a signed byte than clearly these values must be limited to an absolute decimal value maximum of 127 to prevent from overflowing the byte. This same suggestion applies to other values such as CREDIT and extends to various integer representations (i.e. multiple bytes), or floating point implementations as well.

Another valuable property of this extension of the present invention, is that the NB_CSB can be applied to the increment-decrement function described earlier for integer format applications. This is because the extension allows signal tracking within the noise band; therefore, for integer applications, the smart filter output no longer would need to change by one regardless in order to track a signal change. It could change by one only when |NB_CSB| reaches AMT6 as in step 77, which maintains the signal tracking ability without requiring the smart filter output to change every cycle.

It is to be understood that the description of the preferred embodiments are intended to be only illustrative, rather than exhaustive, of the present invention. Those of ordinary skill will be able to make certain additions, deletions, or modifications to the embodiments of the disclosed subject matter without departing from the spirit of the invention or its scope, as defined by the appended claims.

What is claimed is:

1. In a device having an input and an output, said device operating in repetitively occurring predetermined intervals of time, a method for processing a digital signal at said input during that one of said predetermined intervals of time which is presently occurring to thereby provide a filtered digital signal at said output, said device including means for storing said filtered digital signal at said output and a trend indicator, said method comprising the steps of:
   a) calculating the difference in amplitude between said digital signal at said input during said presently occurring one of said predetermined intervals of time and said filtered digital signal at said output stored in said means for storing during a previously occurring one of said predetermined intervals of time;
   b) determining whether said trend indicator stored in said means for storing during said previously occurring one of said predetermined intervals of time permits a tracking credit;
   c) calculating the permitted tracking credit as a function of an assumed noiseband of said digital signal at said input during said presently occurring one of said predetermined intervals of time and said difference in amplitude;
   d) comparing said difference in amplitude:
      i. to said trend indicator; and
      ii. to a predetermined amount based on a function of said assumed noiseband;
   e) changing said trend indicator:
      i. to zero either when said difference and said trend indicator disagree or when the absolute value of said difference is less then said predetermined amount based on a function of said assumed noiseband; or
      ii. by adding to said trend indicator the permitted tracking credit and a predetermined amount related to the polarity of said difference;
   f) calculating a filter factor based on a function of said trend indicator changed during said presently occurring one of said predetermined intervals of time;
   g) using said filter factor in said device to thereby provide said filtered digital signal at said output; and
   h) replacing said filtered digital signal at said output and said trend indicator stored in said means for storing during said previously occurring one of said predetermined intervals of time with said filtered digital signal and said trend indicator changed during said presently occurring one of said predetermined intervals of time in said means for storing.

2. In a device having an input and an output, said device operating in repetitively occurring predetermined intervals of time, a method for processing a digital signal at said input during that one of said predetermined intervals of time which is presently occurring to thereby provide a filtered digital signal at said output, said digital signal at said input having an assumed noiseband, said device including means for storing said filtered digital signal at said output, a first trend indicator and a second trend indicator based on said assumed noiseband, said method comprising the steps of:
   a) calculating the difference in amplitude between said digital signal at said input during said presently occurring one of said predetermined intervals of time and said filtered digital signal at said output stored in said means for storing during a previously occurring one of said predetermined intervals of time;
   b) determining whether said first trend indicator stored in said means for storing during said previously occurring one of said predetermined intervals of time permits a tracking credit;

c) calculating the permitted tracking credit as a function of said assumed noiseband of said digital signal at said input during said presently occurring one of said predetermined intervals of time and said difference in digital signal amplitude;

d) comparing said difference in said digital signal amplitude:
  i. to said first trend indicator;
  ii. to a first predetermined amount based on a function of said assumed noiseband; and
  iii. to zero;

e) changing both said first and said second trend indicators to zero either;
  i. when said difference and said first trend indicator disagree; or
  ii. when said difference is equal to zero; or
  iii. when the absolute value of said difference is less then said first predetermined amount based on a function of said assumed noiseband and said difference disagrees with said second trend indicator; or adding to said first trend indicator the permitted tracking credit and a first predetermined amount related to the polarity of said difference, when the absolute value of said difference is not less than said first predetermined amount based on a function of said assumed noiseband; or changing said second trend indicator by adding thereto a second predetermined amount related to the polarity of said difference, if said difference agrees with said second trend indicator, and then, if the absolute value of said second trend indicator is greater then a second predetermined amount based on a function of said assumed noiseband, changing said second trend indicator to zero and adding to said first trend indicator the permitted tracking credit and said first predetermined amount related to the polarity of said difference;

f) calculating a filter factor based on a function of said first trend indicator changed during said presently occurring one of said predetermined intervals of time;

g) using said filter factor in said device to thereby provide said filtered digital signal at said output; and h) replacing said filtered digital signal at said output and said first and second trend indicators stored in said means for storing during said previously occurring one of said predetermined intervals of time with said filtered digital signal and said first and second trend indicator changed during said presently occurring one of said predetermined intervals of time in said means for storing.

* * * * *